(12) United States Patent
Lawson

(10) Patent No.: US 6,301,179 B1
(45) Date of Patent: Oct. 9, 2001

(54) SELF-EQUALIZED LOW POWER PRECHARGE SENSE AMP FOR HIGH SPEED SRAMS

(75) Inventor: David C. Lawson, Hartwood, VA (US)

(73) Assignee: BAE Systems Information and Electronic Systems Integration, Inc., Manassas, VA (US)

(*) Notice: Subject to any disclaimer, the term of this patent is extended or adjusted under 35 U.S.C. 154(b) by 0 days.

(21) Appl. No.: 09/570,064

(22) Filed: May 12, 2000

Related U.S. Application Data

(60) Provisional application No. 60/181,559, filed on Feb. 10, 2000, and provisional application No. 60/137,224, filed on Jun. 1, 1999.

(51) Int. Cl.[7] .................................................. G11C 7/00
(52) U.S. Cl. ........................................ 365/207; 365/203
(58) Field of Search .................................. 365/207, 203, 365/190, 204, 154, 208

(56) References Cited

U.S. PATENT DOCUMENTS

| | | | |
|---|---|---|---|
| 5,228,106 | * 7/1993 | Ang et al. ............................ | 365/203 |
| 5,315,555 | * 5/1994 | Choi ..................................... | 365/203 |
| 5,467,312 | * 11/1995 | Albon et al. ......................... | 365/203 |
| 5,485,430 | * 1/1996 | McClure .............................. | 365/203 |
| 5,619,466 | * 4/1997 | McClure .............................. | 365/207 |
| 5,841,718 | * 11/1998 | Watters et al. ....................... | 365/203 |
| 6,049,493 | * 4/2000 | Kitamoto et al. ................... | 365/207 |

* cited by examiner

Primary Examiner—Tan T. Nguyen
(74) Attorney, Agent, or Firm—Venable; Richard L. Aitken

(57) ABSTRACT

In a sense amplifier for reading out memory cells of a memory comprising a set of P-FETs and N-FETs, complementary input signals received from the memory cell being read out are applied to input junctions connected to gates of N-FETs. The input junctions are charged to 0.8 volts by a precharging circuit comprising P-FETs connecting the input junctions to ground and an N-FET shunting the input junctions together. The P-FETs and N-FETs of the precharging circuit are rendered conductive between memory cells readouts to precharge the input junctions and are rendered nonconducting during memory cell readouts. A second precharging circuit precharges an output junction of the sense amplifier circuit. The output junction is connected to an output amplification stage including a CMOS circuit. Because of the low equalization voltage to which the input junctions are precharged, the time to precharge the input junctions is dramatically reduced and a reduction in the memory access time is achieved.

33 Claims, 5 Drawing Sheets

SELF-EQUALIZED LOW POWER PRECHARGE SENSE AMP FOR HIGH SPEED SRAMS

This invention claims the benefit of provisional application No. 60/137,224, filed Jun. 1, 1999, and provisional application No. 60/181,559, filed Feb. 10, 2000.

This invention was made with Government support under Contract No. DSWA01-96-C-0106 awarded by the Department of Defense. The Government has certain rights in this invention.

BACKGROUND OF THE INVENTION

1. Technical Field

The present invention relates generally to sense amplifier circuits and, more particularly, to sense amplifier circuits.

2. Description of the Related Art

Sense amplifiers for use in memory arrays are well known. A typical sense amplifier is used to detect signals of low power received from the cells within the memory array and convert the signals to power levels compatible with the rest of the system in which the memory is used at a high speed. As memory density increases, the memory cell size and the corresponding cell output signal power is reduced, thereby making the sense amplifier critical for achieving satisfactory power output in the high speed read out of memory cells in a high density memory.

A conventional sense amplifier detects the memory cell output through a differential amplifier, which is highly sensitive, but has very small voltage gain. The output signals from a memory cell are in the form of electric charges, which change the charge level at input junctions of the sense amplifier. In order to obtain a reliable, rapid readout of the memory cell, the input functions of the sense amplifier need to be precharge, between memory cell readouts, to the same voltage level. This process is called equalization.

An example of a sense amplifier of the prior art is shown in FIG. 1. As shown in this figure, the sense amplifier comprises a series of P-FETs and N-FETs. In a FET, the term "source" is used to refer to the end terminal at which carriers are introduced into the conductive path of the FET and the term "drain" is used to refer to the end terminal which receives the carriers from the conductive path. The source and drain are structurally identical and, accordingly, are interchangeable. Complementary signals, cdlt and cdlc, are applied to the sense amplifier on lines 16 and 18 when a memory cell is read out. Complementary signals are a pair of binary signals, each of which represent binary values with opposite signal levels. In the case of the signals cdlt and cdlc, when the cdlt signal is at relatively high voltage when a memory cell is being read out, the cdlc signal will be relatively low and vice versa. In the sense amplifier of FIG. 1, the complementary memory output signals cdlt and cdlc are applied to the gates of N-FETs 17 and 19, respectively. The lower terminals of the FETs 17 or 19, serving as sources, are connected together and through a series connection of N-FETs 21 and 23 to ground. The upper terminals of the N-FETs 17 and 19, serving as drains, are connected through P-FETs 27 and 29, respectively, to voltage source vdd at 3.3 volts. The drain of the N-FET 17 is connected to the gate of the N-FET 21 and is connected to the gates of the P-FETs 27 and 29. An enable signal is connected to the gate of the N-FET 23. The enable signal goes high during the cell readout and goes low between cell readouts. The drain of N-FET 19 is connected to the output junction 30 of the first stage of the sense amplifier and feeds an output amplification stage 32.

The circuit junction 34 at the gate of the N-FET 17 and the circuit junction 36 at the gate of the N-FET 19 are precharge through a circuit comprising N-FETs 38, 40 and 42. The N-FET 38 is connected between the circuit junction 34 and the voltage source vdd. The N-FET 40 is connected between the junction 36 and the voltage source vdd. The N-FET 42 is connected between the circuit junctions 34 and 36. The output stage 32 comprises a P-FET 44, an N-FET 46 and an N-FET 48 connected series between the voltage vdd and ground. The output junction 30 is connected to the gates of the P-FET and the N-FET 46.

An enable_b signal, which is complementary to the enable signal, is applied to the gates of the N-FETs 38, 40 and 42 and renders these FETs conductive between cell readouts and turns these N-FETs off during the cell readouts. As a result, between cell readouts, the junctions 34 and 36 will be shorted together through the N-FET 42 and will be precharge from the vdd source to an equalization voltage of 2.5 volts (3.3 volts minus the threshold voltage of 0.8 volts for the N-FETs 38 and 40). During a memory cell readout, one of the circuit junctions 34 and 36 will be driven high by the complementary signals received from the memory cell and the other junction 34 or 36 will be driven low. When junction 36 is driven high and junction 34 is driven low, the N-FET 19 will be turned on and the N-FET 17 will be turned off. The turning off of the N-FET 17 will cause the gate of the N-FET 21 to go high turning on the N-FET 21 and will cause the gates of the P-FETs 27 and 29 to go high to cause these P-FETs to turn off. Since the enable signal during cell readout will be high, the N-FET 23 will be also conductive. As a result of the N-FETs 19, 21 and 23 being rendered conductive, a conducting path will be established from the output junction 30 to ground and, as a result, the output junction 30 will discharge to a low potential. When the complementary input signals drive input junction 34 high and input junction 36 low, the FET 19 will be cut off and the output junction 30 will remain charged at a high potential. When the output junction 30 is high, conduction through the P-FET in the output stage 44 will be cut off and the N-FET 46 will be rendered conductive. As a result, output connector 50 of the sense amplifier, connected to the junction between the P-FET 44 and the N-FET 46, will be cut off from the vdd voltage and will be connected through the conductive N-FETs 46 and 48 to ground so that the output voltage on connector 50 will go low. Conversely, when the output junction 30 is low, the N-FET 46 will become nonconductive and the P-FET 44 will become conductive. As a result, the output connector 50 will have a conductive path to the voltage source vdd and a high output voltage will be produced.

During the precharging of the input junctions 34 and 36, the sense amplifier consumes power due to heavy capacitive loading on lines 16 and 18. In addition, because the equalization voltage is relative high at 2.5 volts, more time is required to precharge the input junctions and the response of the sense amplifier to the complementary input signals is delayed because the precharge voltage is not close to the threshold at which the FETs 17 and 19 are switched between conductive ands nonconductive states.

For the reasons given above, and for reasons that will become apparent to those skilled in the art from reading and understanding the present specification, there is a need for a sense amplifier which takes less time to precharge the input junctions, which responds more rapidly to the output signals from a memory cell, and which consumes very little power.

SUMMARY OF THE INVENTION

The above-mentioned problems with sense amplifiers in the prior art are addressed by the present invention which will be understood by reading and studying the following specification.

The sense amplifier of the invention comprises a self-equalized low powered precharge circuit having rapid precharge capability and a low power requirement. Rapid precharge and a lower power requirement are achieved by virtue of a reduced equalization potential. In the present design, the equalization potential is close to the threshold level at which FETs in the sense amplifier receiving the output signals from a memory cell are switched between non-conductive and conductive states. The low equalization potential is achieved by precharging the input circuit junctions to 0.8 volts above ground through P-FETs. With the sense amplifier configured in this manner, the time to precharge the sense amplifier is reduced and very little power is consumed. The low equalization potential near the threshold of the N-FETs receiving the memory cell signals and the reduction in precharge time for the input junctions reduce the memory cell access time. The sense amplifier FETs have width to length ratios to operate in their linear region, further improving access time. The output circuit junction is also precharged and equalized through cross-coupled P-FET devices between memory cell read outs. As a result, an overall dramatic reduction in memory access time is achieved.

In addition to the above described advantages, the circuit has the unexpected advantage of permitting the supply voltage for the circuit to be substantially reduced without degrading the performance of the circuit. A reduction in the supply voltage, instead of increasing the memory access time, reduces the access time even further. This advantage results from the connection of the sources of the FETs receiving the memory output signals being connected to the power source through cross coupled FETs, which have lower width to length ratios than the FETs receiving memory cell output signals.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
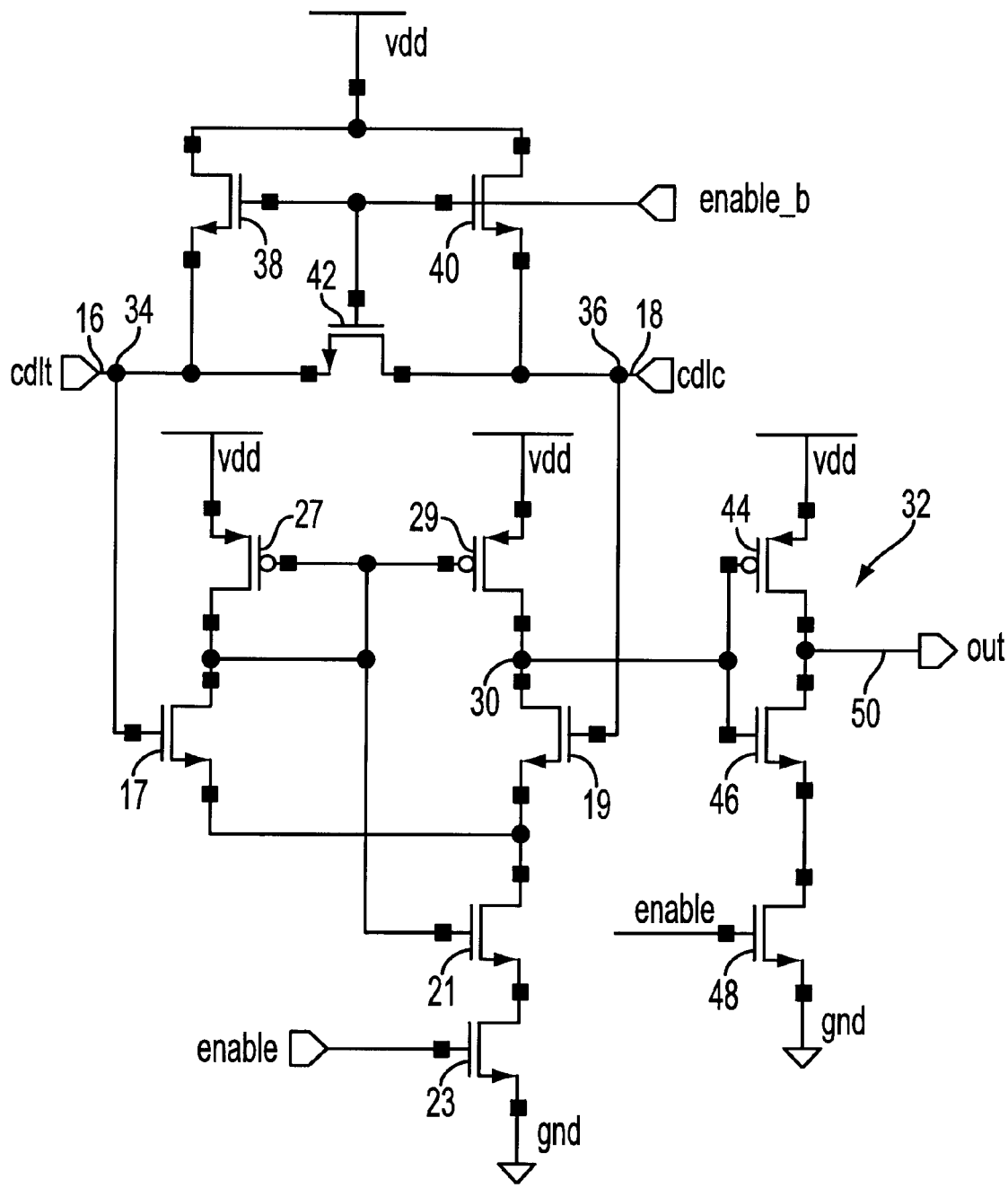
FIG. 1 illustrates a sense amplifier of the prior art.
Figure 2:
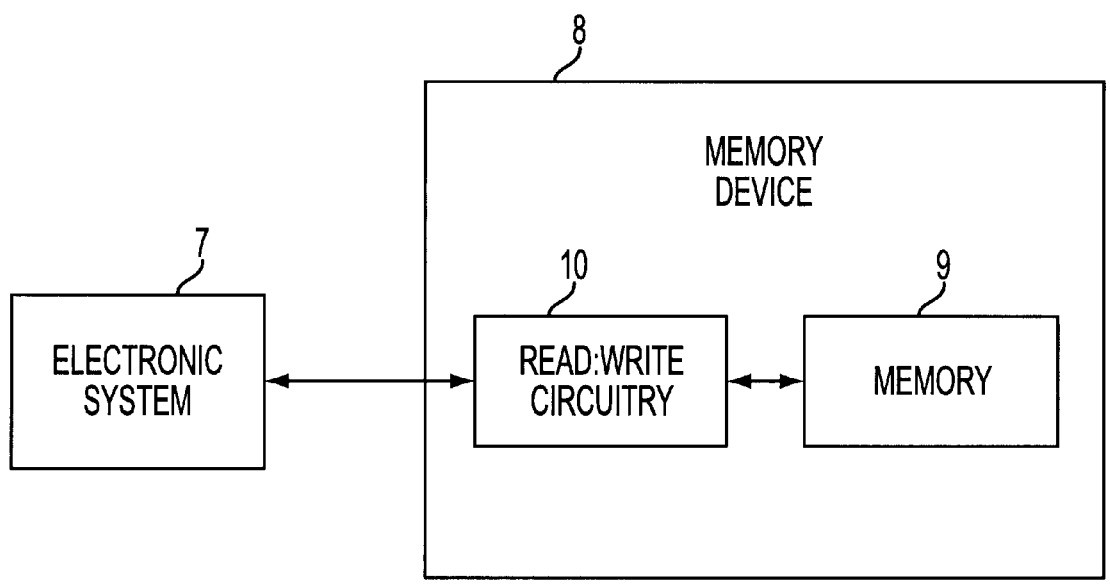
FIG. 2 is a block diagram of a data processing system employing the present invention.
Figure 3:
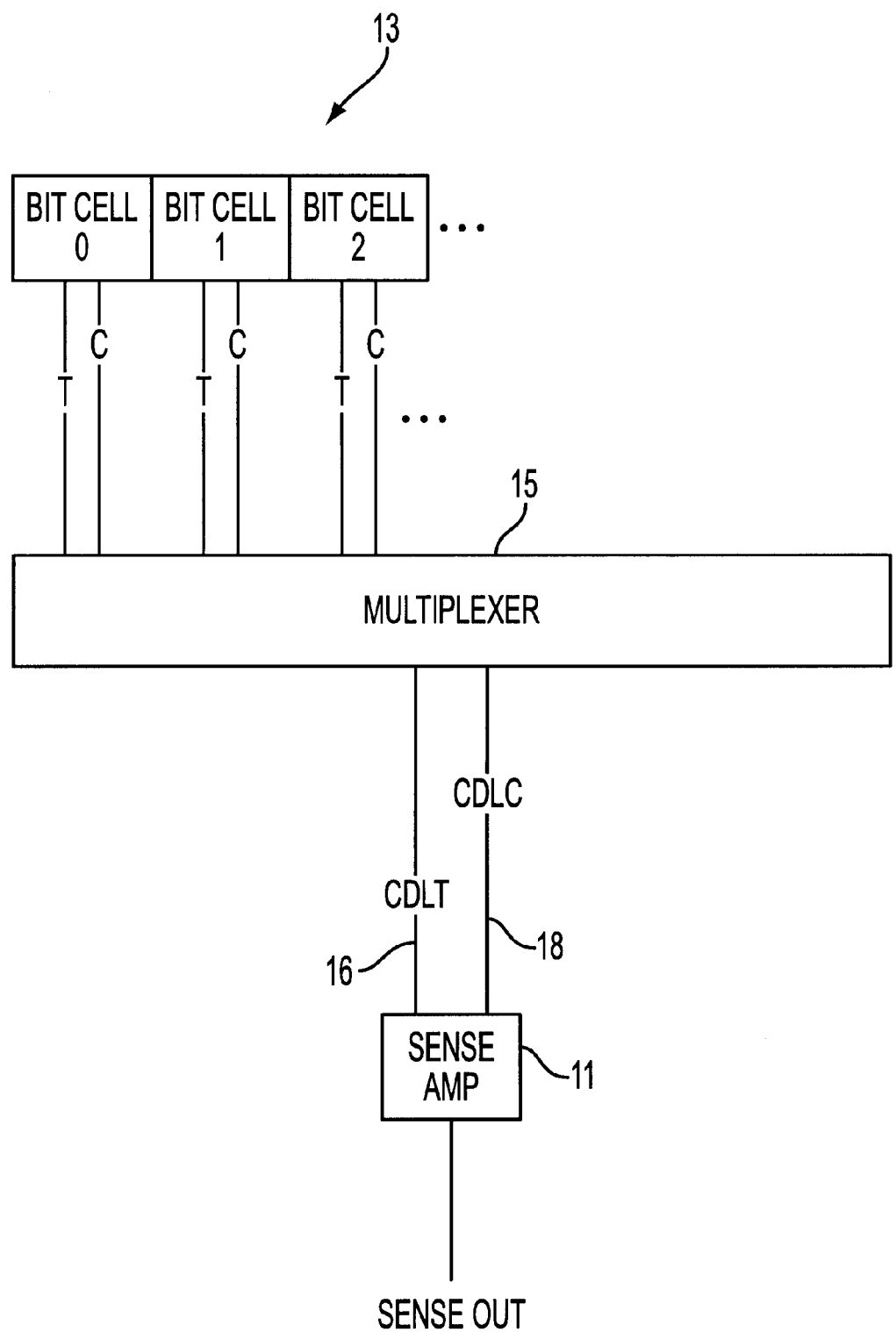
FIG. 3 is a block diagram showing a memory connected with a sense amplifier of the present invention.

In the system shown in FIG. 2, an electronic system 7 is coupled to a memory device 8, which comprises a static random access memory 9 (SRAM) and read-write circuitry 10. The electronic system 7 comprises, for example, a microprocessor, memory controller, a chip set, or other appropriate system that stores data in and reads data out from a memory device. The memory 9 comprises anarray of memory cells and the electronic system 7 controls the read-write circuitry 10 to store data in and to read data from the memory cells of the memory 9. As shown in FIG. 3, the read-write circuitry 10 includes a sense amplifier 11 which is selectively connected to memory cells 13 of the memory 9 via a multiplexer 15. The sense amplifier 11 will receive complementary output signals, cdlt and cdlc, called bit line signals, on bit lines 16 and 18 from one of memory cells 13 selected by the multiplexer 15.

Figure 4:
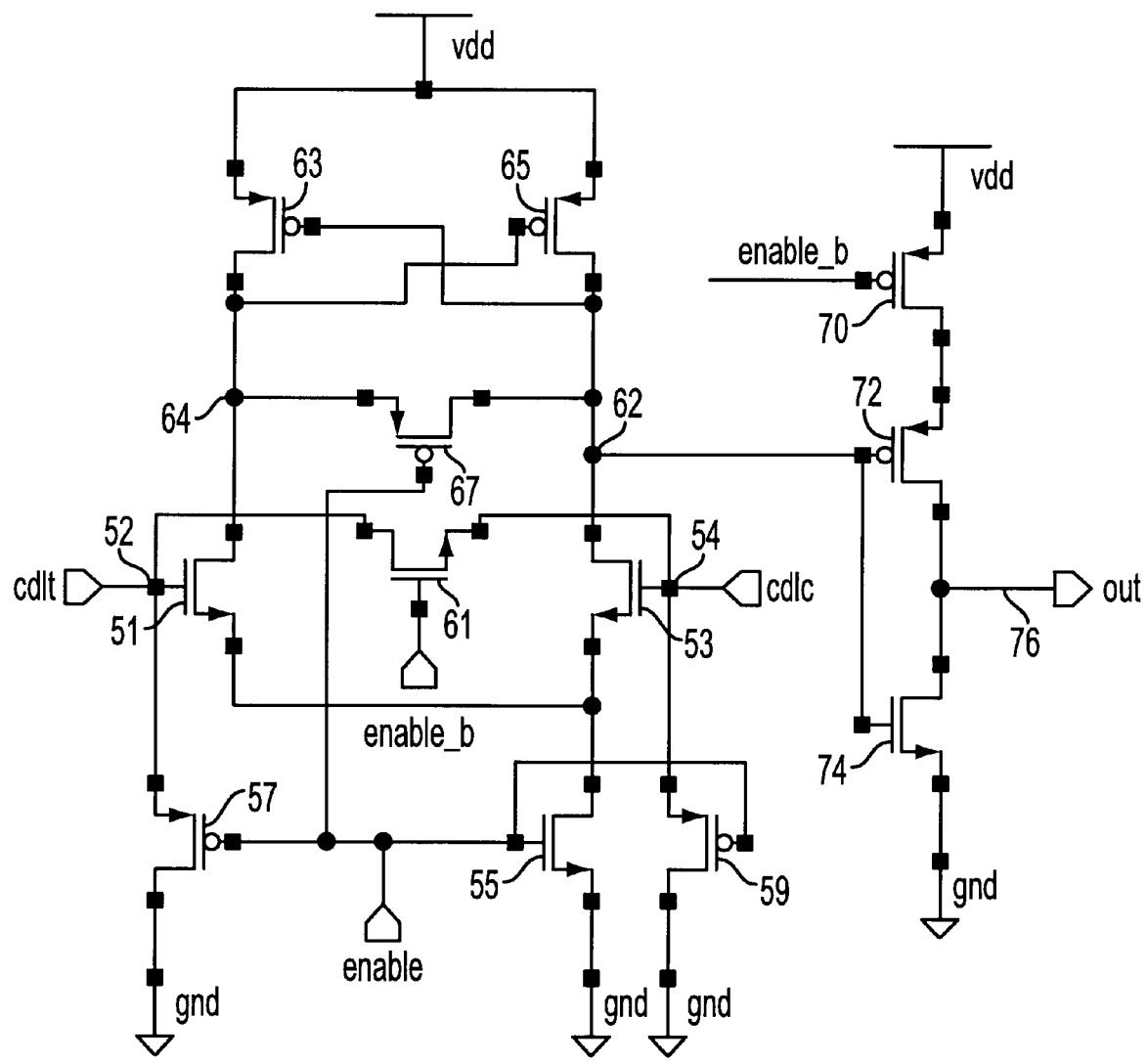
FIG. 4 is a circuit diagram of the sense amplifier of the invention.

The circuit of the sense amplifier 11 is shown in FIG. 4. In the sense amplifier, the equalization voltage at the input junctions at which the complementary bit line input signals from the memory cell are applied is reduced and, in addition, a precharging equalization voltage is applied to the output junction of the first stage of the sense amplifier. As shown in FIG. 4, the complementary input signals are applied to input junctions 52 and 54 connected to the gates of N-FETs 51 and 53, respectively. The lower terminals of the FETs 51 and 53, serving as sources, are connected together and through an N-PET 55 to ground. The gates of the FETs 51 and 53 are connected to ground respectively through P-FETs 57 and 59. The circuit junction at the upper terminal of the FET 53, serving a as a drain, forms the output junction 62 for the first stage of the sense amplifier. The output junction 62, as well as a circuit junction 64 at the drain of the FET 51, are connected through cross coupled P-FETs 63 and 65 to the voltage source of 3.3 volts vdd. The cross coupling is provided by the lower terminal of the FET 63, serving as a drain, being connected to the gate of the FET 65 and the lower terminal of the FET 65, serving as a drain, being connected to the gate of the FET 63. A P-FET 67 connects the junctions 62 and 64 together. The output stage of the sense amplifier comprises a P-FET 70 and a CMOS circuit of a P-FET 72 and N-FET 74 connected in series between the voltage vdd and ground. The output junction 62 of the first stage of the amplifier is connected to the gates of the FETs 72 and 74.

The gates of the P-FETs 57 and 59 are connected to the enable signal input. As a result, the FETs 57 and 59 will be turned off during the readout of a cell and are turned on by the enable signal going low between cell readouts. The input junctions 52 and 54 will also be shorted together by conduction through the N-FET 61 between the readout of memory cells caused by an enable_b signal applied to the gate of the FET 61. The enable_b signal is complementary to the enable signal and will be high when the enable signal is low (between memory cell readouts) and will be low when the enable signal is high (during memory cell readout). The enable_b signal cuts off conduction though the FET 61 during readout of a memory cell. The FETs 57, 59 and 61 by being conductive between memory cell readouts serve to precharge and equalize the input voltage at the circuit junctions 52 and 54. At the end of a cell readout, one of the input junctions 52 or 54 will be at about 2 volts and the other input junction will be at about ground. If the junction 52 is high, at 2 volts, then when the FETs 57, 59 and 61 are rendered conductive, the 2 volt charge at junction 52 will discharge through the FET 57 and through the series circuit of the FETs 61 and 59 to ground to drop the charge at the junction 52 to the threshold voltage of 0.8 volts for the FET 57 and to raise the voltage at the junction 54 to the threshold voltage of 0.8 volts for the FET 59. The threshold voltage for a FET is defined as the voltage between the drain and source below which conduction through the FET will not occur. As a result, the junctions 52 and 54 are equalized at 0.8 volts between memory cell readouts. In a similar manner, when the input junction 54 is high and the input junction 52 is low at the end of a memory cell readout, the input junction 54 will discharge from two volts to 0.8 volts and the input junction 52 will rise from ground volts to 0.8 volts through the conduction of FETs 57, 59 and 61 at the end of a memory cell readout. The output junction 62, as well as the circuit junction 64 at the drain of the FET 51, are precharge between the readout of memory cells by the conduction through the FETs 63 and 65.

The first stage of the amplifier of FIG. 4 is a differential amplifier and functions to amplify the difference in the signal voltages applied to input junctions 52 and 54. During the readout of a memory cell, one of the cdlt and cdlc signals will be driven high and the other will be driven low. The enable signal is applied to gate of the N-FET 55 to turn the N-FET 55 on during the read out of a memory cell. Assuming that cdlt goes high during memory cell read out, then FET 51 will become conductive and the circuit junction 64 at the drain of the FET 51 will be driven low. Accordingly, the P-FET 65 will become conductive. At the same time, the cdlc component of the complementary input signals will be driven high and will render the FET 53 non-conductive. As a result, the drain of the FET 53 and the output circuit junction 62 will be driven high. When the readout of a memory cell ends, the enable signal will go low and the FET 67 will be rendered conductive shorting the circuit junctions 62 and 64 together. This action will discharge the potential at the circuit junction 62 toward that of the circuit junction 64 and, as the result, both FETs 63 and 65 will be initially rendered conductive when the enable signal goes low at the end of a cell readout. Accordingly, a charge will flow from vdd through the FETs 63 and 65 to the circuit junctions 62 and 64. As a result, the potential at these circuit junctions will rise. This action, in turn, will subsequently cause the current flow through the FETs 63 and 65 to cut off, but not until the junctions 62 and 64 are charged to 2.5 volts (3.3 volts minus the 0.8 threshold voltage for the FETs 63 and 65).

If the cdlc signal is high during the previous cell readout, the cdlt signal will be low so that the FET 53 is conducting and the FET 51 is cut off. As a result, the circuit junction 64 will be high during the previous cell readout. When the readout of the memory cell ends and the enable signal goes low so that the FET 67 is rendered conductive, the potential at the circuit junction 64 will drop towards the potential at the output junction 62 so that both FETs 63 and 65 will be initially rendered conductive when the enable signal goes low at the end of the cell readout. Thus, charge will flow from vdd through the FETs 63 and 65 to the circuit junctions 62 and 64 and these circuit junctions will be charged to 2.5 volts before the FETs 63 and 65 cut off. In this manner, the output junction 62 is precharge between the cell readouts.

In the output stage, the enable_b signal is applied to the gate of the FET 70 to render this FET conductive during cell readout and non-conductive between the readout of cells. When the output junction 62 is driven low by the cdlc signal going high during a cell readout, the FET 74 will be cut off and the FET 72 will be turned on so that a high potential from vdd will charge the output conductor 76. When the output junction 62 is high because of the cdlc signal being low during cell readout, the FET 74 will be rendered conductive and the FET 72 will be rendered non-conductive. As a result, the output conductor 76 will discharge to low.

Figure 5:
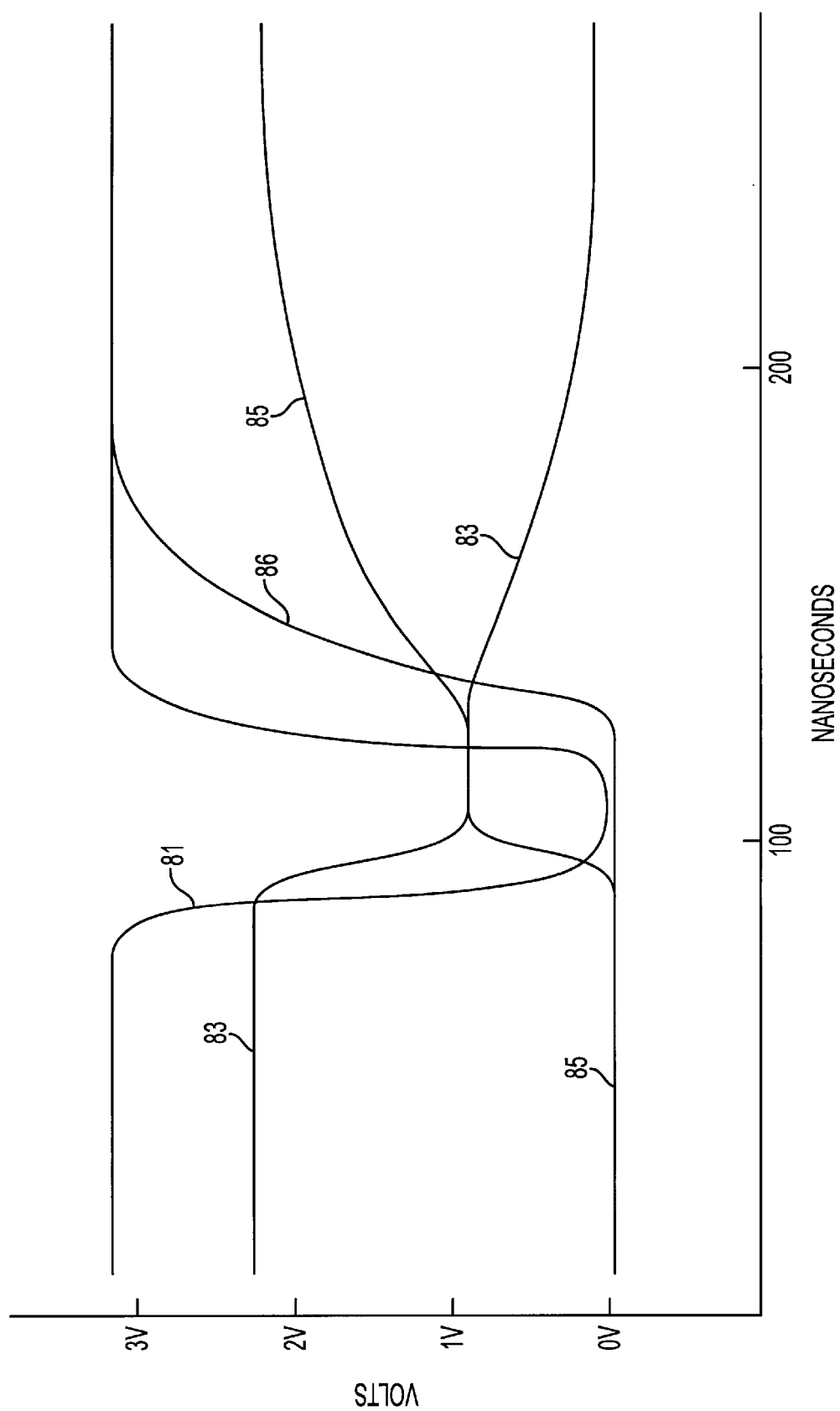
FIG. 5 depicts a timing relationship between waveforms in the sense amplifier of FIG. 3.

The wave forms shown in FIG. 5 illustrate the operation of the circuit of FIG. 4. As shown in FIG. 5, the enable signal wave form, designated by reference number 81, is at about 3.0 volts during cell readout and drops to 0 volts between cell readout. The signal voltages at the input junctions 52 and 54, represented by waveforms 83 and 85, go to ground and 2.0 volts during a memory cell read out. In the example shown, at the end of a first cell read out, the signal voltage at the gate of the FET 51 is high at about 2 volts and at the gate of the FET 53 is low at 0 volts. When the enable signal 81 goes to 0 volts between cell readouts, the input junctions 52 and 54 are equalized at 0.8 volts as shown where waveforms 83 and 85 come together. Then, when the next cell is read out, the signal voltages at the input junctions (waveforms 83 an 85) separate and trigger the differential amplification action of the circuit. In the example represented by FIG. 5, the voltage in the output conductor 76, as shown by waveform 86, will be driven from low at zero volts to high at about 3 volts. Because the equalization voltage is at about the threshold at which the FETS 51 and 53 turn on, the signal voltages at the input junctions do not have to separate very far to trigger the amplification action. The voltage difference between the signal voltages at input junctions is called bit line separation. In the example shown, the signal voltage on input junction 52 rises to about 2 volts and the signal at input junction 54 drops to 0.

In the sense amplifier shown in FIG. 4, the time to precharge the sense amplifier input junctions is reduced because the voltage to which the circuit is precharge is only 0.8 volts, which is about halfway between the input voltages to which the input junctions 52 and 54 are charged during a memory cell readout. As a result, a rapid precharge of the input junctions is achieved. In addition, the equalization potential, 0.8 volts, is at (very close to) the threshold potential at which the FETs 51 and 53 begin to conduct. As a result, a rapid response to the changing signal voltages at the input junctions 52 and 54 at the start of a memory cell read out is achieved. Also, the output signal junction is also precharged. Through these features a dramatic overall reduction in SRAM access time is achieved. Moreover, the circuit draws essentially no DC power.

The ratios of the width to length of the FETs of the circuit are selected so that the FETs operate in their linear region. In the preferred embodiment, the ratio of the width to length of the FETs 63 and 65 is less than the ratio of the width to length of the FETs 51 and 53. This feature increases voltage drops through the FETs 63 and 65 when they are conducting and permits the supply voltage vdd to be scaled down to less than 3.3 volts. With a reduced supply voltage, the speed of operation of the circuit in responding to the input signals from a memory cell is further increased. This increase in speed is obtained with no deleterious effect on the operation of the circuit. The supply voltage can be reduced to 1.65 volts with an attendant increase in speed of response and without degradation of the amplifier's operation.

Although a specific embodiment has been illustrated and described herein, it will be appreciated by those of ordinary skill in the art that any arrangement which is calculated to achieve the same purpose may be substituted for the specific embodiment shown. This application is intended to cover any adaptations or variations of the present invention. For example, the circuit could be redesigned to use N-FETs in place of P-FETs and vice versa. The equalization voltage of 0.8 volts, while preferred because of the facility with which it is set by the use of P-FETs, can be varied to other low voltage values which will achieve the same or similar advantages.

What is claimed is:

1. A sense amplifier for use in memory arrays having a plurality of random access memory cells, said amplifier comprising:

a first pair of FETs adapted to receive on the gates thereof complementary input signals from a memory cell during readout of said memory cell, a circuit connecting the FETs of said first pair in parallel between a voltage source and ground, one of said first pair of FETs being rendered conductive and the other one of said first pair of FETs being rendered nonconductive by said complementary input signals during a memory cell readout, and a second pair of FETs connected between the gates of the FETs of said first pair and ground, said second pair of FETs being rendered conductive between memory cells readouts and being rendered non-conductive during memory cell readout.

2. A sense amplifier as recited in claim 1, wherein the FETs of said second pair of FETs ate P-FETs.

3. A sense amplifier as recited in claim 2, wherein said first pair of FETs are N-FETs.

4. A sense amplifier for use in memory arrays having a plurality of static random access memory cells, said amplifier comprising:

a first pair of FETs adapted to receive on the gates thereof complementary input signals from a memory cell during readout of said memory cell, a circuit connecting the FETs of said first pair in parallel between a voltage source and ground, one of said first pair of FETs being rendered conductive and the other one of said first pair of FETs being rendered nonconductive by said complementary input signals during a memory cell readout, and a second pair of FETs connected between the gates of said first pair of FETs and ground, said second pair of FETs being rendered non-conductive during memory cell readout and being rendered conductive between memory cell readouts to precharge input circuit junctions connected to the gates of said first pair of FETs to the threshold voltages of said FETs of said second pair.

5. A sense amplifier for use in memory arrays having a plurality of random access memory cells, said amplifier comprising:

a first pair of FETs adapted to receive on the gates thereof complementary input signals from a memory cell during readout of said memory cell, a circuit connecting the FETs of said first pair in parallel between a voltage source and ground, one of said first pair of FETs being rendered conductive and the other one of said first pair of FETs being rendered nonconductive by said complementary input signals during a memory cell readout, a second pair of FETs connected between the gates of said first pair of FETs and ground, said second pair of FETs being rendered non-conductive during memory cell readout and being rendered conductive between memory cell readouts to precharge input circuit junctions connected to the gates of said first pair of FETs to a predetermined equalization voltage, and a fifth FET connected between the gates of the FETs of said first pair, said fifth FET being rendered conductive between memory cell readouts and nonconductive during memory cell readouts.

6. A sense amplifier for use in memory arrays having a plurality of random access memory cells, said amplifier comprising:

a first pair of FETs adapted to receive on the gates thereof complementary input signals from a memory cell during readout of said memory cell, a circuit connecting the FETs of said first pair in parallel between a voltage source and ground, one of said first pair of FETs being rendered conductive and the other one of said first pair of FETs being rendered nonconductive by said complementary input signals during a memory cell readout, and a second pair of FETs connected between the gates of said first pair of FETs and ground, said second pair of FETs being rendered non-conductive during memory cell readout and being rendered conductive between memory cell readouts to precharge input circuit junctions connected to the gates of said first pair of FETs to an equalization voltage, and an output junction connected to a terminal of one of the FETs of said first pair, said circuit including a precharging circuit connected to precharge said output junction between memory cell readouts.

7. A sense amplifier as recited in claim 6, further comprising an output stage including a CMOS circuit, said CMOS circuit including an N-FET and a P-FET connected in series between said voltage source and ground, said output junction being connected to the gates of the FETs of said CMOS circuit.

8. A sense amplifier for use in memory arrays having a plurality of random access memory cells, said amplifier comprising:

a pair of FETs adapted to receive on the gates thereof complementary input signals from a memory cell during readout of said memory cell, a circuit connecting said FETs in parallel between a voltage source and ground, one of said of FETs being rendered conductive and the other one of said of FETs being rendered nonconductive by said complementary input signals during a memory cell readout, a precharging circuit connected to the gates of said pair of FETs to precharge input circuit junctions connected to the gates of said pair of FETs to about 0.8 volts.

9. A sense amplifier for use in memory arrays having a plurality of random access memory cells, said amplifier comprising:

a first pair of FETs adapted to receive on the gates thereof complementary input signals from a memory cell during readout of said memory cell, a circuit connecting said FETs of said first pair in parallel between a voltage source of less than 3.3 volts and ground, said circuit comprising a second pair of FETs severally connected between the FETs of said first pair and said voltage source, one of said FETs of said first pair being rendered conductive and the other one of said FETs being rendered nonconductive by said complementary input signals during a memory cell readout, a precharging circuit connected to the gates of said FETs of said first pair to precharge input circuit junctions connected to the gates of said FETs of said first pair to predetermined potentials between the potentials to which said input circuit junctions are driven during memory cell readout.

10. A sense amplifier as recited in claim 9, wherein the FETs of said second pair are cross coupled.

11. A sense amplifier as recited in claim 9, wherein the ratio of the width to length of the conducting path of said first pair of FETs is greater than the width to length ratio of the conducting path of said second pair of FETs.

12. A sense amplifier for use in memory arrays having a plurality of static random access memory cells, said amplifier comprising:

a first pair of FETs adapted to receive on the gates thereof complementary input signals from a memory cell during readout of said memory cell, a circuit connecting said FETs in parallel between a voltage source of 1.65 volts and ground, said circuit comprising a second pair of FETs severally connected between the FETs of said first pair and said voltage source, one of said FETs of said first pair being rendered conductive and the other one of said FETs of said first pair being rendered nonconductive by said complementary input signals during a memory cell readout, a precharging circuit connected to the gates of said FETs of said first pair to precharge input circuit junctions connected to the gates of said FETs of said first pair to predetermined potentials between the potentials to which said input circuit junctions are driven during memory cell readout.

13. A sense amplifier as recited in claim 12, wherein the FETs of said second pair are cross coupled.

14. A sense amplifier as recited in claim 12, wherein the ratio of the width to length of the conducting path of said first pair of FETs is greater than the width to length ratio of the conducting path of said second pair of FETs.

15. A sense amplifier for use in memory arrays having a plurality of random access memory cells, a first pair of FETs adapted to receive on the gates thereof complementary input signals from a memory cell during readout of said memory cell, a circuit connecting said FETs in parallel between a voltage source and ground, one of said FETs being rendered conductive and the other of said FETs being rendered nonconductive by said complementary input signals during memory cell readout, a precharging circuit connected to the gates of said first pair FETs to precharge input circuit junctions connected to the gates of said FETs to predetermined potentials at about the threshold potential at which said FETs are rendered conductive.

16. A sense amplifier for use in a memory array having a plurality of random access memory cells, said amplifier comprising a pair of N-FETs adapted to receive on the gates thereof complementary input signals from the memory cell during readout of said memory cell, a circuit connecting said N-FETs in parallel between a voltage source and ground, one of said N-FETs being rendered conductive and the other one of said N-FETs being rendered nonconductive by said complementary input signals during a memory cell readout, a precharging circuit comprising a pair of P-FETs connected between the gates of said N-FETs and ground, said P-FETs being rendered conductive between memory cell readouts to precharge input junctions connected to the gates of said N-FETs to potentials set at the threshold voltages of said P-FETs between memory cell readouts and being rendered nonconductive during memory cell readout.

17. An amplifier comprising a plurality of transistors each having first and second end terminals and a gate controlling conductivity in a path between the first and second end terminals of such transistor, first and second transistors of said plurality being adapted to receive complementary input signals on the gates thereof, a third transistor of said plurality connected to said first transistor with its path connected between the first end terminal of said first transistor and a source of power, a fourth transistor of said plurality connected to said second transistor with its path connected between the first end terminal of said second transistor and said source of power, a circuit cross-coupling said third and fourth transistors, a fifth transistor of said plurality connected to said first and second transistors with its conductive path connected between the first end terminal of said first transistor and the first end terminal of said second transistor, a sixth transistor of said plurality connected to said first and second end transistors with its path connected between the second end terminals of said first and second transistors and ground, a seventh transistor of said plurality connected to said first transistor with its path connected between the gate of said first transistor and ground, an eighth transistor of said plurality connected to said second transistor with its path connected between the gate of said second transistor and ground, and a ninth transistor of said plurality connected to said first and second transistors with its path connected between the gates of said first and second transistors.

18. An amplifier as recited in claim 17, wherein said transistors are FETS.

19. An amplifier as recited in claim 17, wherein said first and second transistors are N-FETs and said seventh and eighth transistors are P-FETs.

20. An amplifier comprising a plurality of FETs each having first and second end terminals and a gate controlling conductivity in a path between the first and second end terminals of such transistor, first and second FETs of said plurality being adapted to receive complementary input signals on the gates thereof, a third FET of said plurality connected to said first FET with its path connected between the first end terminal of said first FET and a source of power, a fourth FET of said plurality connected to said second FET with its path connected between the first end terminal of said second FET and said source of power, a circuit cross-coupling said third and fourth FETs, a fifth FET of said plurality connected to said first and second FETs with its path connected between the second end terminals of said first and second FETs and ground, a sixth FET of said plurality connected to said first FET with its path connected between the gate of said first FET and ground, a seventh FET of said plurality connected to said second FET with its path connected between the gate of said second FET and ground.

21. A memory readout and amplification system comprising a memory, said memory comprising a plurality of memory cells, said memory cells generating complementary output signals upon being read out, a sense amplifier having input junctions, a multiplexer for selecting one of said memory cells and applying the complementary signals generated by the selected memory cell to said input junctions, said amplifier comprising:
a pair of FETs having their gates connected to said input junctions, a circuit connecting said FETs in parallel between the source of power and ground whereby one of said pair of FETs will be rendered conductive and the other one of said pair of FETs will be rendered nonconductive by said complementary input signals during a memory cell readout, a precharging circuit operable to precharge said input junctions between memory cell readouts to a potential at about the threshold at which said FETs become conductive.

22. A memory readout and amplification system comprising a memory, said memory comprising a plurality of memory cells, said memory cells generating complementary output signals upon being read out, a sense amplifier having input junctions, a multiplexer for selecting one of said memory cells and applying the complementary signals generated by the selected memory cell to said input junctions, said amplifier comprising:
a pair of FETs having their gates connected to said input junctions, a circuit connecting said FETs in parallel between the source of power and ground whereby one of said pair of FETs will be rendered conductive and the other one of said pair of FETs will be rendered nonconductive by said complementary input signals during a memory cell readout, a precharging circuit operable to precharge said input junctions between memory cell readouts about 0.8 volts.

23. A memory readout and amplification system comprising a memory, said memory comprising a plurality of memory cells, said memory cells generating complementary output signals upon being read out, a sense amplifier having input junctions, a multiplexer for selecting one of said memory cells and applying the complementary signals generated by the selected memory cell to said input junctions, said amplifier comprising:

a first pair of FETs having their gates connected to said input junctions, a circuit connecting the FETs of said first pair in parallel between the source of power and ground whereby one of said pair of FETs will be rendered conductive and the other one of said pair of FETs will be rendered nonconductive by said complementary input signals during a memory cell readout, a second pair of FETs connected between the gates of said first pair of FETs and ground, a source of enable signals connected to the gates of said second pair of FETs to render the FETs of said second pair conductive between memory cell readouts to precharge said input junction to the threshold voltage of the FETs of said second pair.

24. A memory readout and amplification system comprising a memory, said memory comprising a plurality of memory cells, said memory cells generating complementary output signals upon being read out, a sense amplifier having input junctions, a multiplexer for selecting one of said memory cells and applying the complementary signals generated by the selected memory cell to said input junctions, said amplifier comprising:

a first pair of FETs having their gates connected to said input junctions, a circuit connecting said FETs in parallel between a voltage source of less than 3.3 volts and ground whereby one of said pair of FETs will be rendered conductive and the other one of said pair of FETs will be rendered nonconductive by said complementary input signals during a memory cell readout, said circuit including a second pair of cross coupled FETs connected between said first pair of FETs and said source of power, a precharging circuit operable to precharge said input junctions between memory cell readouts to a potential between the potentials to which said input junctions are driven by said complementary signals during memory are read out.

25. A method of operating a sense amplifier having first and second inputs and an output comprising:

applying an equalization voltage to said fist and second inputs substantially equal to a threshold voltage at which a transistor in said amplifier switches between a conductive and nonconductive state, applying external signals to said first and second inputs, and amplifying a difference between the signals applied to said first and second inputs.

26. A method as recited in claim 25, further comprising:

providing a supply voltage to said sense amplifier that is substantially greater than twice said threshold voltage.

27. A method reading and amplifying signals from a memory cell using an amplifier comprising a pair of FETs with input junctions connected to the gates of said pair of FETs comprising precharging said input junctions to a potential near the potential at which said pair of FETs become conductive, reading out a memory cell to generate complementary signals, and applying said complementary signals to said input junctions to render one of said FETs conductive and the other one of said FETs nonconductive.

28. A method of reading out and amplifying signals from a memory cell using an amplifier having a first pair of FETs, input junctions connected to the gates of said first pair of FETs, and a second pair of FETs connected between the gates of said first pair of FETs and ground comprising precharging said input junctions to the threshold voltages of said second pair of FETs by rendering said second pair of FETs conductive, reading out a memory cell to generate complementary signals, and applying said complementary signals to said input junctions to render, one of said FETs conductive and one of said FETs nonconductive.

29. A method as recited in claim 28, further comprising precharging an output junction of said amplifier circuit to a predetermined potential prior to the reading out of said memory cell.

30. An apparatus comprising:

an electronic system;

a memory comprising a plurality of memory cells;

read-write circuitry coupled to said electronic system and said memory;

said electronic system controlling said read-write circuitry to store data in and read data from said memory cells;

said memory cells each generating complementary signals upon being read out;

said read-write circuitry including a sense amplifier having input junctions and applying the complementary signals generated by a selected memory cell of said memory to said input junctions;

said sense amplifier comprising a pair of FET's having their gates connected to said input junctions, a circuit connecting said FET's in parallel between a source of power and ground whereby one of said pair of FET's will be rendered conductive and the other one of aid pair of FET's will be rendered nonconductive by said complementary input signals during a memory cell readout, a precharging circuit operable to precharge said input junctions between memory cell readouts to a potential at about the threshold at which said FET's become conductive.

31. An apparatus comprising:

an electronic system;

a memory comprising a plurality of memory cells;

read-write circuitry coupled to said electronic system and said memory;

said electronic system controlling said read-write circuitry to store data in and read data from said memory cells;

said memory cells generating complementary signals upon being read out;

said read-write circuitry including a sense amplifier having input junctions and applying the complementary signals generated by a selected memory cell of said memory to said input junctions;

said sense amplifier comprising a pair of FET's having their gates connected to said input junctions, a circuit connecting said FET's in parallel between a source of power and ground whereby one of said pair of FET's will be rendered conductive and the other one of aid pair of FET's will be rendered nonconductive by said complementary input signals during a memory cell readout, a precharging circuit operable to precharge said input junctions between memory cell readouts to about 0.8 volts.

32. An apparatus comprising:

an electronic system;

a memory comprising a plurality of memory cells;

read-write circuitry coupled to said electronic system and said memory;

said electronic system controlling said read-write circuitry to store data in and read data from said memory cells;

said memory cells each generating complementary signals upon being read out;

said read-write circuitry including a sense amplifier having input junctions and applying the complementary signals generated by a selected memory cell of said memory to said input junctions;

said sense amplifier comprising a first pair of FET's having their gates connected to said input junctions, a circuit connecting the FET's of said first pair in parallel between a source of power and ground whereby one of said pair of FET's will be rendered conductive and the other one of said pair of FET's will be rendered nonductive buy said complementary input signals during a memory cell readout, a second pair of FET's connected between the gates of said first pair of FET's and ground, a source of enable signals connected to the gates of said second pair of FET's to render the FET's of said second pair conductive between memory cell readouts to precharge said input junctions to the threshold voltage of the FET's of said second pair.

33. An apparatus comprising:

an electronic system;

a memory comprising a plurality of memory cells;

read-write circuitry coupled to said electronic system and said memory;

said electronic system controlling said read-write circuitry to store data in and read data from said memory cells;

said memory cells each generating complementary signals upon being read out;

said read-write circuitry including a sense amplifier having input junctions and applying the complementary signals generated by a selected memory cell of said memory to said input junctions;

said sense amplifier comprising a first pair of FET's having their gates connected to said input junctions, a circuit connecting said FET's in parallel between a voltage source of less than 3.3 volts and ground whereby one of said pair of FET's will be rendered conductive and the other one of said pair of FET's will be rendered nonconductive by said complementary input signals during a memory cell readout, said circuit including a second pair of cross coupled FET's connected between said first pair of FET's and said source of power, a precharging circuit operable to precharge said input junctions between memory cell readouts to a potential between the potentials to which said input junctions are driven by said complementary signals during memory cell read out.

* * * * *